United States Patent
Marshall et al.

(10) Patent No.: US 6,605,339 B1
(45) Date of Patent: Aug. 12, 2003

(54) MICRO HEAT BARRIER

(75) Inventors: Albert C. Marshall, Sandia Park, NM (US); Stanley H. Kravitz, Placitas, NM (US); Chris P. Tigges, Albuquerque, NM (US); Gregory A. Vawter, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 30 days.

(21) Appl. No.: 10/025,449

(22) Filed: Dec. 19, 2001

(51) Int. Cl.⁷ .................................................. B32B 3/26
(52) U.S. Cl. ........................ 428/195; 428/220; 428/446; 428/450; 428/698
(58) Field of Search ............................... 428/195, 446, 428/450, 698, 220; 257/706

(56) References Cited

U.S. PATENT DOCUMENTS

| | | | |
|---|---|---|---|
| 5,651,255 A | 7/1997 | Oweis et al. | 62/46.2 |
| 5,681,661 A * | 10/1997 | Kelly | 428/601 |
| 6,197,180 B1 | 3/2001 | Kelly | 205/118 |
| 6,276,044 B1 * | 8/2001 | Ragland et al. | 29/521 |

OTHER PUBLICATIONS

Randall F. Barron; "Monographs On Cryogenics 3, Cryogenics Systems 2$^{nd}$ ed." No Date.

American Institute of Chemical Engineers, "Aerospace Power Systems and Technologies"; Jul. 27–Aug. 1, 1997.

L. S. Fletcher, "Recent Developments in Contact Conductance Heat Transfer" Nov. 1988 vol. 110.

Hüffman, Matsuda, Miskolczy & Wang; "Meltdown Characteristics of Multi–Foil Thermal Insulation" Copyright 1979 American Chemical Society. No Month.

Zaidi; "Enhanced Light Absorption of Solar Cells and Photodetectors by Diffraction". No Date.

* cited by examiner

Primary Examiner—Deborah Jones
Assistant Examiner—Stephen Stein
(74) Attorney, Agent, or Firm—Robert D. Watson

(57) ABSTRACT

A highly effective, micron-scale micro heat barrier structure and process for manufacturing a micro heat barrier based on semiconductor and/or MEMS fabrication techniques. The micro heat barrier has an array of non-metallic, freestanding microsupports with a height less than 100 microns, attached to a substrate. An infrared reflective membrane (e.g., 1 micron gold) can be supported by the array of microsupports to provide radiation shielding. The micro heat barrier can be evacuated to eliminate gas phase heat conduction and convection. Semi-isotropic, reactive ion plasma etching can be used to create a microspike having a cusp-like shape with a sharp, pointed tip (<0.1 micron), to minimize the tip's contact area. A heat source can be placed directly on the microspikes. The micro heat barrier can have an apparent thermal conductivity in the range of $10^{-6}$ to $10^{-7}$ W/m-K. Multiple layers of reflective membranes can be used to increase thermal resistance.

65 Claims, 21 Drawing Sheets

MICRO HEAT BARRIER

CROSS-REFERENCE TO RELATED APPLICATIONS

This application is related to U.S. patent applications "Self-Powered Microthermionic Converter," by Marshall, et al., Ser. No. 10/028,144, filed Dec. 20, 2001; and "Methods for Fabricating a Micro Heat Barrier" by Marshall, et al., Ser. No. 10/025,718, filed Dec. 19, 2001; and the specifications thereof are incorporated herein by reference.

FEDERALLY SPONSORED RESEARCH

The United States Government has rights in this invention pursuant to Department of Energy Contract No. DE-AC04-94AL85000 with Sandia Corporation.

BACKGROUND OF THE INVENTION

The present invention relates generally to highly effective thermal insulation, and more specifically to a micro heat barrier comprising a highly reflective membrane supported by micron-scale microsupports fabricated using semiconductor and MEMS processing techniques. The present invention also relates to processes for fabricating micro heat barriers.

A need exists in a variety of industrial, scientific, and military applications for a highly efficient, lightweight thermal insulation. In particular, microelectronic and micro-electro-mechanical-systems (MEMS) devices need very thin (micron-scale) advanced thermal insulators to enable efficient thermal management schemes. An advanced Micro Heat Barrier (MHB) can be used for a variety of thermal management applications, such as:

Controlling parasitic heat flow in a variety of integrated circuit (IC) devices, surface emitting lasers (LED, VSCEL) for communications and lighting, micro-cryogenics, micro-heaters for micro chemlab on-a-chip, etc., Controlling hot spots on compact lap top computers, cell phones, etc., Enabling micro power conversion devices for MEMS, micro sensor, or micro chemlab applications, including self-powered micro thermionic converters, micro thermovoltaics, micro thermionics, and micro thermoelectric devices, Thermal control of micro sensors, and Thermal control for microbiological cell culture applications.

For applications like self-powered microthermionic converters made using IC, MEMS, and surface micromachine techniques, temperature gradients of more than 1100 C. must be maintained over very short distances (e.g., less than 150 microns). Unfortunately, the very short thermal conduction path severely limits the ability of conventional bulk thermal insulators, such as silicon, silicon dioxide, or silicon nitride, to provide effective thermal isolation using. Hence, advanced thermal barriers are needed.

Effective thermal insulators use an insulating material having low thermal conductivity (e.g., ceramic, plastic, glass), combined with a vacuum gap and/or reflective internal surfaces (e.g., Thermos™ bottle). While a vacuum gap eliminates thermal conduction over the region not in contact, some type of mechanical support is needed to maintain the gap. As a consequence, heat loss can occur by conduction through the supports. On the micro scale even modest contact areas of more conventional insulators results in unacceptably high thermal conduction heat losses. Furthermore, at high temperatures heat loss across the gap can result from thermal radiation. Radiative heat transfer (Infrared Radiation, IR) is minimized by using highly reflective (i.e., non-absorbing) surfaces (e.g., polished metal surfaces).

Highly efficient thermal insulators have been made by alternating layers of reflective material (aluminum foil, copper foil, or aluminized Mylar™) separated by low thermal conductivity spacers (e.g., fibrous material), or by crinkling the reflective material to allow contact at only a few points. Operation in a vacuum further improves the thermal insulation by eliminating conduction and convection in the gas. This type of multilayer insulation is commonly used for cyrogenic insulation. Such a multilayer insulator can have an apparent thermal conductivity as low as $10^{-5}$ W/m-K, which is approximately 100,000 times less conductive than quartz.

For high temperature heat engines, solar Stirling engines, and radioisotope or thermionic space power sources, materials with high melting points must be used for the multi-layered insulation. One commercially available example. is the MULTI-FOIL™ insulation developed by Thermo Electron Corporation. A typical MULTI-FOIL™ uses 60–80 stacked layers of thin metal foils (e.g., 12.5 microns thick) of reflective metals (e.g., niobium, molybdenum, zirconia-coated aluminum) separated by small particles of low conductivity oxides (e.g., zirconium oxide). The fabrication process (and corresponding large dimensions) developed for manufacturing multilayer insulations, such as MULTI-FOIL™ insulation, makes this technology unsuitable for use in MEMS and microthermionic converters. Also, the thermal emissivity of metal foils ranges are relatively high (0.3–0.4) due to the native oxide present on the foils.

In U.S. Pat. No. 6,197,180 Kelly teaches a process for fabricating high aspect ratio microstructures by electroplating nickel using the LIGA process to form a heat shield comprising a forest of nickel "umbrellas" connected to the substrate by nickel microposts, where the microposts have a height of 100–1000 microns. The use of electroplated nickel microposts, however, limits the ability to achieve highly effective thermal insulation because of nickel's high thermal conductivity. Also, the height of the microposts (100–1000 microns) limits their use in MEMS or other microelectronic devices (which require thermal insulation barriers with a thickness on the order of 10 microns, not 100–1000 microns).

A need exists, therefore, for a highly effective, micron-scale micro heat barrier structure and a process for fabricating, that combines the advantages of multilayer vacuum thermal insulation with the micron-scale fabrication techniques of semiconductor, micromachine, MEMS, or microthermionic devices, having an apparent thermal conductivity much lower than existing multifoil insulation, and that can be directly integrated into the fabrication process of the semiconductor, micromachine, MEMS, or microthermionic device.

Against this background, the present invention was developed.

SUMMARY OF THE INVENTION

The present invention relates to a highly effective, micron-scale micro heat barrier structure and process for manufacturing a micro heat barrier based on semiconductor and/or MEMS fabrication techniques. The micro heat barrier has an array of non-metallic, freestanding microsupports with a height less than 100 microns, attached to a substrate.

An infrared reflective membrane (e.g., 1 micron gold) can be supported by the array of microsupports to provide radiation shielding. The micro heat barrier can be evacuated to eliminate gas phase heat conduction and convection. Semi-isotropic, reactive ion plasma etching can be used to create a microspike having a cusp-like shape with a sharp, pointed tip (<0.1 micron), to minimize the tip's contact area. A heat source can be placed directly on the microspikes. The micro heat barrier can have an apparent thermal conductivity in the range of $10^{-6}$ to $10^{-7}$ W/m-K. Multiple layers of reflective membranes can be used to increase thermal resistance.

BRIEF DESCRIPTION OF THE DRAWINGS

The accompanying drawings, which are incorporated in and form part of the specification, illustrate various examples of the present invention and, together with the detailed description, serve to explain the principles of the invention.

DETAILED DESCRIPTION OF THE INVENTION

In general, the micro heat barrier of the present invention combines the use of semiconductor, micromachine, MEMS, and microthermionic fabrication processes with a multilayered design to realize a highly effective thermal insulator having an overall thickness less than on the order of 10 microns. In one embodiment, the present invention combines widely-spaced, micron-scale, non-metallic support posts (e.g., 1–3 microns tall) having very small contact dimensions (e.g., less than 0.1 micron diameter), a vacuum environment, and one or more highly reflective membranes (i.e., gold with reflectivity of about 95–98%) to produce a micro heat barrier having an apparent thermal conductivity a factor of 10–100 times lower than the best insulation currently available, including multilayered, MULTI-FOIL™ insulation. Thermal conduction through the support posts is minimized by using tapered microposts (i.e., microcones or microspikes) having pointed tips (e.g., 0.1 micron diameter) and narrow cross-section, made of poor thermal conductors, such as silicon, germanium, or gallium arsenide.

Figure 1A:
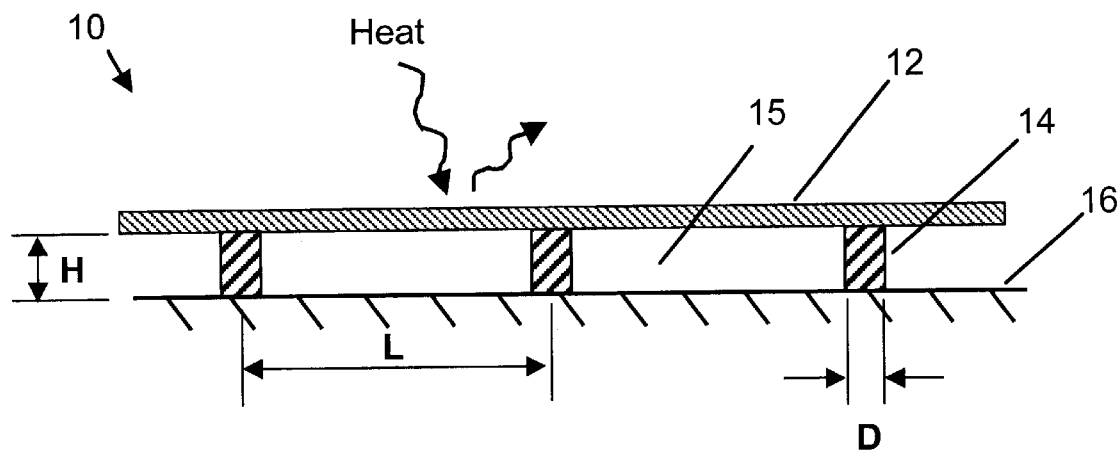
FIG. 1(a) schematically illustrates a cross-section view of an example of a micro heat barrier (MHB) according to the present invention.

FIG. 1(a) schematically illustrates a cross-section view of an example of a micro heat barrier (MHB) according to the present invention. MHB 10 comprises at least one reflective membrane 12 comprising an infrared (IR) reflective material, supported by a plurality of non-metallic microposts 14 disposed on a substrate 16. The height, H, of micropost 14 can be from 1–100 microns. MHB 10 is oriented perpendicular to the direction of heat flow (i.e., the plane of reflective membrane 12 is oriented substantially parallel to substrate 16). Substrate 16 is typically flat, but can be curved or otherwise non-flat. A gap 15 exists in-between foil 12 and substrate 16. Gap 15 can comprise air. However, thermal conduction and convection through the air can decrease the apparent thermal conductivity of MHB 10. Gap 15 can comprise a gas having a lower thermal conductivity than air, such as argon or krypton, to reduce heat loss by conduction in the gas. Alternatively, gap 15 can be evacuated to create a vacuum, e.g., less than about 10 mPa, which effectively eliminates heat loss due to gas phase conduction and convection.

The plurality of microposts 14 can be uniformly spaced apart a distance L from each other, in a square, hexagonal, or other suitable repeating pattern. The plurality of microposts 14 can be widely spaced, i.e., L/H>10, to minimize the amount of heat conducted through the supports by minimizing the total number of microposts per unit area of reflective membrane 12. However, the spacing, L, between microposts 14 cannot be so great that reflective membrane 12 sags excessively or has inadequate structural support to prevent breakage from shock or vibration. Micropost 14 can have a cylindrical geometry, with a basal diameter=D. For example, micropost 14 can be fabricated with D=1 micron, H=3 microns, and L=50 microns, with the plurality of microposts 14 being arranged in a square pattern (L/H=16.7).

Figure 1B:
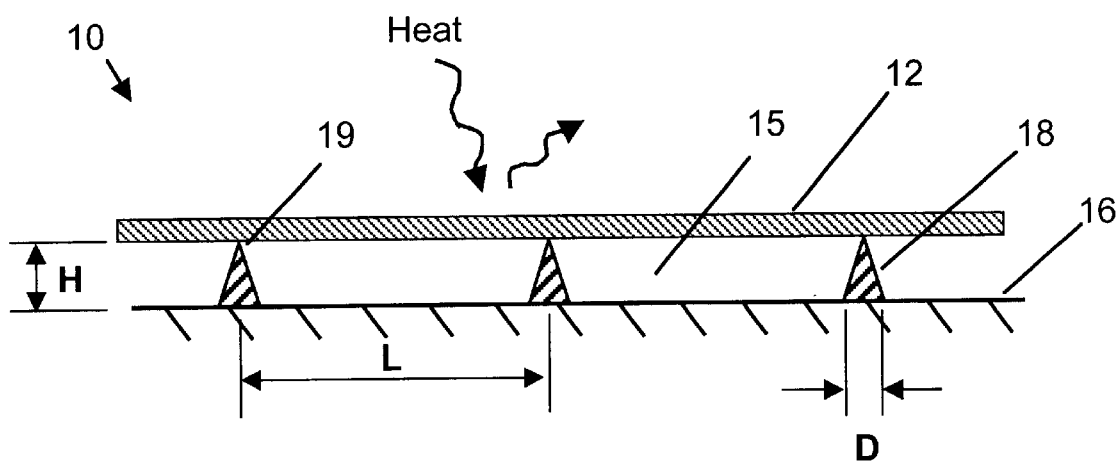
FIG. 1(b) schematically illustrates a cross-section view of another example of a micro heat barrier (MHB) according to the present invention.

FIG. 1(b) schematically illustrates a cross-section view of another example of a micro heat barrier (MHB) according to the present invention. Reflective membrane 12 is supported by a plurality of microcones 18. Microcone 18 has a tapered, pyramidal or conical shape, which minimizes the contact area of tip 19 with reflective membrane 12. Microcone 18 has a reduced average thermal conductivity as compared to cylindrically shaped micropost 14 due to the reduced average cross-sectional area of microcone 18 (assuming that microcone 18 and micropost 14 have the same basal diameter D).

Figure 1C:
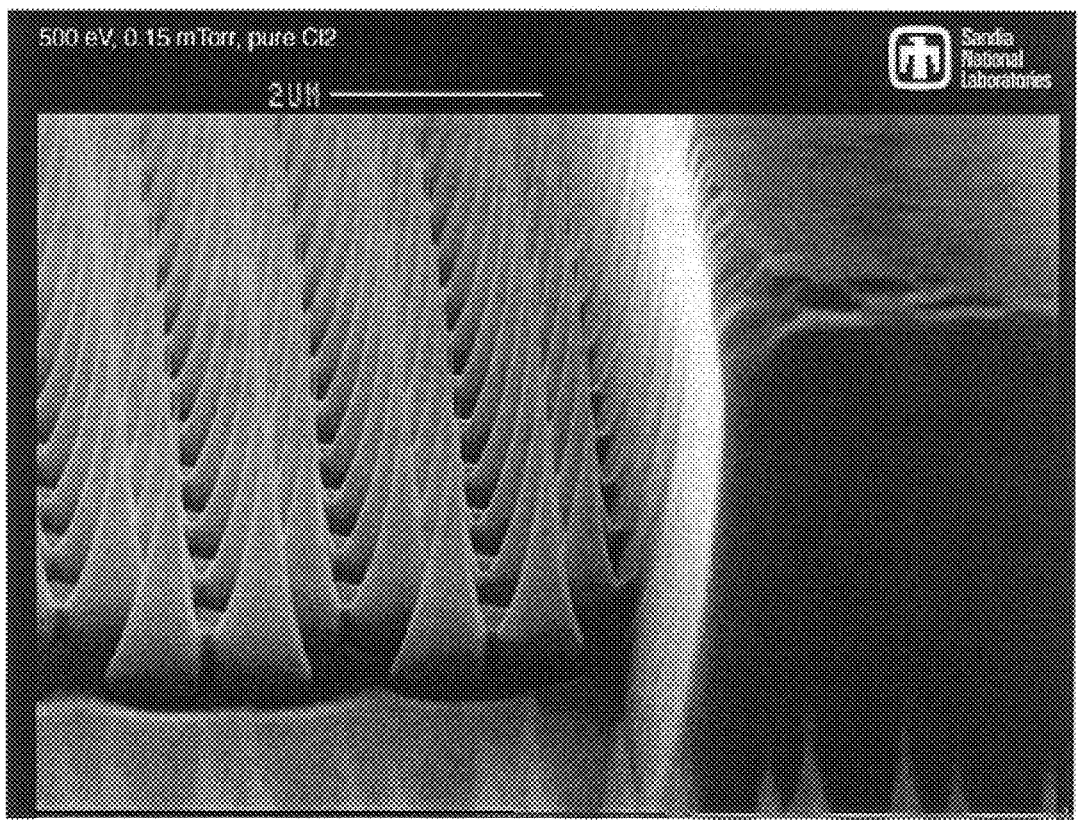
FIG. 1(c) shows a scanning electron microscope image of an array of GaAs microcones with sharp tips, made by high temperature reactive ion beam etching, according to the present invention.

FIG. 1(c) shows a scanning electron microscope image of an array of GaAs microcones with sharp tips, made by high temperature reactive ion beam etching, according to the present invention. The dimensions of one of these microcones is as follows: the height is approximately 3 microns, the diameter of the base is approximately 1 micron, and the tip's diameter is approximately 0.1 microns (i.e., 100 nanometers).

Figure 1D:
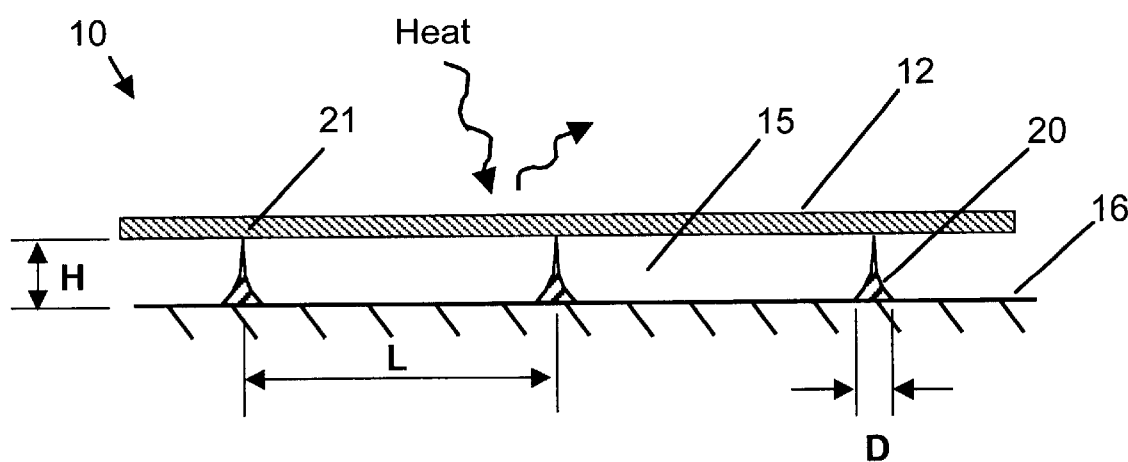
FIG. 1(d) schematically illustrates a cross-section view of another example of a micro heat barrier (MHB) according to the present invention.

FIG. 1(d) schematically illustrates a cross-section view of another example of a micro heat barrier (MHB) according to the present invention. Reflective membrane 12 is supported by a plurality of microspikes 20. Microspike 20 has a sharp-tipped, pointed "spike" or "cusp-like" shape (i.e., Eiffel Tower shape) that further minimizes the contact area of sharp tip 21 with reflective membrane 12, and further reduces the average thermal conductivity of spike-shaped micropost 20.

The extremely small contact area of the cusp of spike tip 21 can generate additional thermal resistance (i.e., Kapitza resistance) due to quantum scattering of phonons, which enhances thermal contact resistance, especially at cyrogenic temperatures.

Figure 1E:
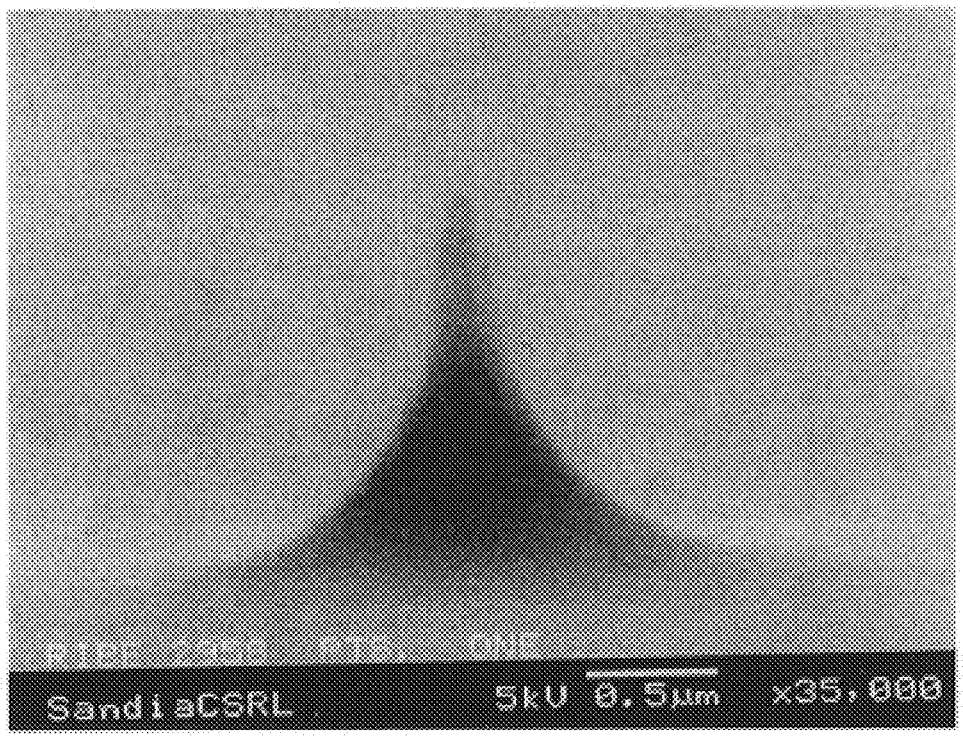
FIG. 1(e) shows a scanning electron microscope image of a GaAs microspike with a sharp, cusp-like tip, fabricated according to the present invention.

FIG. 1(e) shows a scanning electron microscope image of a GaAs microspike with a sharp, cusp-like tip, fabricated according to the present invention. The dimensions of this microspike is as follows: the height and the diameter of the base are both approximately 1 micron, and the tip's diameter is less than 0.1 microns (i.e., 100 nanometers). Single microspikes are commonly used as the tip of an Atomic Force Microscope (AFM) that have similarly sharp tips with nanometer dimensions.

We define herein the term "microsupports" to encompass microposts 14, microcones 18, and microspikes 20.

The apparent thermal conductivity of micro heat barrier 10 can be decreased in a number of different ways, according to the present invention. The number of microsupports can be decreased by increasing the spacing L between microsupports, which reduces the total cross-sectional area available to conduct heat through the solid microsupports (limited by excessive sagging or stress in reflective membrane 12).

Alternatively, the apparent thermal conductivity can be decreased by increasing the aspect ratio, H/D, of each microsupport; for example, by decreasing the diameter D, or increasing the height H (limited by buckling of micropost 14 if it becomes too slender to support the load), or both. Alternatively, the IR reflectivity of reflective membrane 12 can be increased by proper selection of materials and processing conditions; minimization of surface roughness; control of texture, etc. For example, the IR reflectivity of polished (very flat) pure gold is very high, 98–99%. Non-polished thin gold films also have high reflectivity, i.e., 90%–98%, depending on the surface roughness. Therefore, gold is an excellent choice for reflective membrane 12. Plus, gold does not oxidize if exposed to air when at high temperatures. To minimize the cost of a gold reflective membrane, the thickness can be minimized, consistent with structural limitations. However, if the gold foil is made too thin (e.g., less than about 500 angstroms) it can become transparent in the IR and, hence, no longer IR reflective.

Other materials that have a high IR reflectivity can be used for reflective membrane 12, including copper, platinum, silver, aluminum, rhodium, titanium, and silicon (e.g., polysilicon). In the wavelength range of 3–10 microns, the reflectance of Au, Ag, and Cu are all approximately 98%, Al about 97%, Rh about 90%, and Ti about 60–90%. These materials can be deposited by a variety of well known techniques, including physical vapor deposition (e.g., evaporation), chemical vapor deposition, or sputter deposition.

Figure 2A:
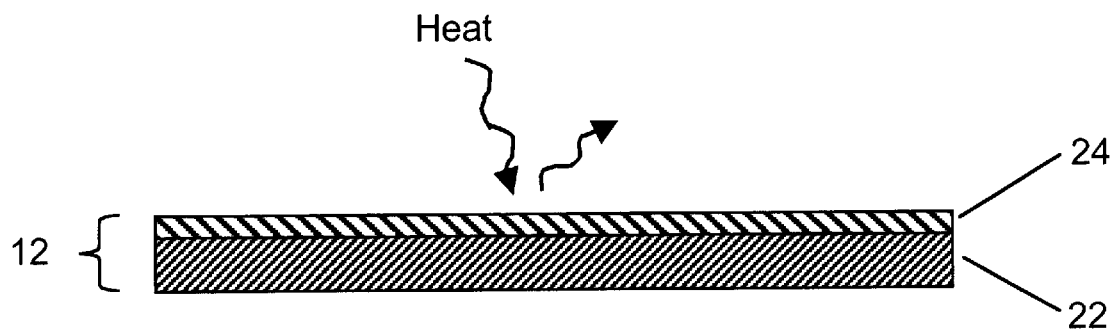
FIG. 2(a) schematically illustrates a cross-section view of another example of a composite, laminated reflective membrane, according to the present invention.

Alternatively, a single sheet of IR reflective membrane 12 can comprise a composite structure comprising one or more laminated layers of different materials. For example, as shown in FIG. 2(a), reflective membrane 12 comprises a structural layer 22 and an attached highly reflective layer 24. Structural layer 22 can be, for example, a low-stress (or stress-less) silicon nitride (silicon oxynitride) film (e.g., 1 micron thick) or a polysilicon film made, for example, using the SUMMIT-IV or SUMMIT-V MEMS fabrication process. Highly reflective layer 24 can be a thin gold film having a thickness (e.g., 0.1–1 microns) sufficient to achieve a high IR reflectivity (i.e., greater than 95%).

Figure 2B:
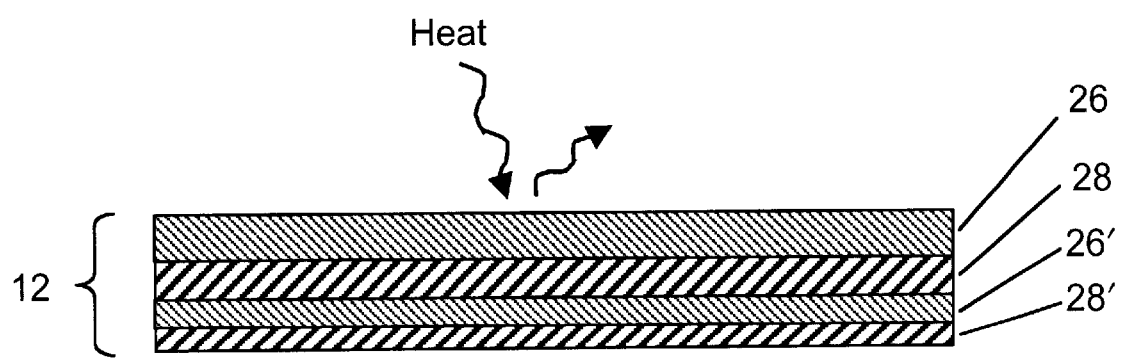
FIG. 2(b) schematically illustrates a cross-section view of an example of a composite, laminated reflective membrane, according to the present invention.

Alternatively, a single sheet of IR reflective membrane 12 can comprise a laminated stack of two alternating layers of IR transparent materials, where one material has a large difference in its index of refraction relative to the other. For example, as shown in FIG. 2(b), reflective membrane 12 comprises four laminated layers of two alternating materials; a low index material 26, 26' (e.g., $SiO_2$, n=1.5), and a high index material 28, 28' (e.g., $TiO_2$, n=2.4). The example of a high reflectivity (HR) stack illustrated in FIG. 2(b) comprises $TiO_2/SiO_2/TiO_2/SiO_2$. The thickness of each layer in the HR stack can vary, depending on its particular location in the stack.

The thickness of each alternating layer 26, 28 is chosen appropriately (e.g., quarter wavelength) to create a highly efficient Bragg-type reflector at the desired wavelength (or range of wavelengths). This design efficiently reflects the incident IR radiation by relying on the constructive and deconstructive addition and subtraction of transmitted and reflected wavefronts, as is well-known in the art.

Figure 3:
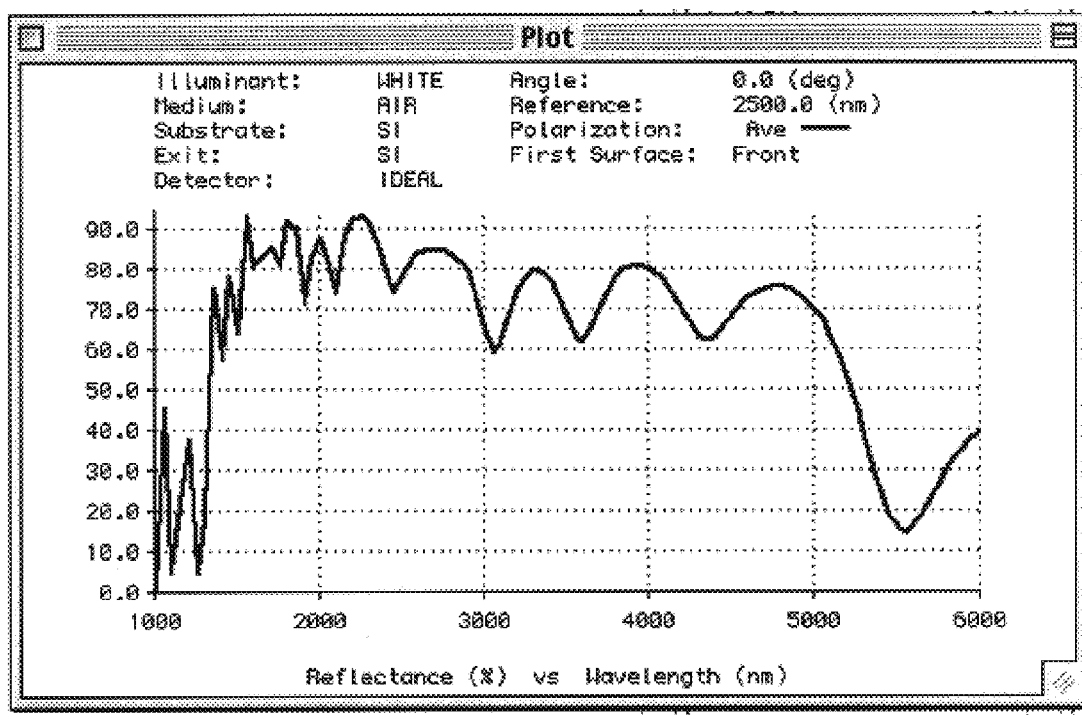
FIG. 3 shows the calculated reflectance of a HR stack as a function of the wavelength of incident light over the range of wavelengths from 1–5 microns.

Table 1 lists another example of a reflective membrane 12, comprising a 17-layer HR stack for reflective membrane 12, made of alternating $SiO_2$ and $TiO_2$ layers of varying thicknesses. FIG. 3 shows the calculated reflectance for this 17-layer HR stack as a function of the wavelength of incident light from 1–5 microns. Reflectivities greater than 60% are predicted over a wide range of wavelengths, with the maximum reaching about 90% at around 1600–2400 nm.

TABLE 1

Multilayer Reflector Design

| Layer No. | SiO$_2$ Thickness (nm) | TiO$_2$ Thickness (nm) |
|---|---|---|
| 1 | 697.56 | |
| 2 | | 448.69 |
| 3 | 743.69 | |
| 4 | | 419.65 |
| 5 | 466.40 | |
| 6 | | 286.61 |
| 7 | 439.98 | |
| 8 | | 249.87 |
| 9 | 466.17 | |
| 10 | | 268.68 |
| 11 | 314.15 | |
| 12 | | 187.98 |
| 13 | 287.72 | |
| 14 | | 200.35 |
| 15 | 321.29 | |
| 16 | | 175.33 |
| 17 | 509.53 | |

In principle, any pair of materials having a large difference in index of refraction can be used for alternating layers 26 and 28 in a HR stack. Examples of these materials include: silicon, magnesium oxide, silicon nitride, and fluoride films.

Figure 4:
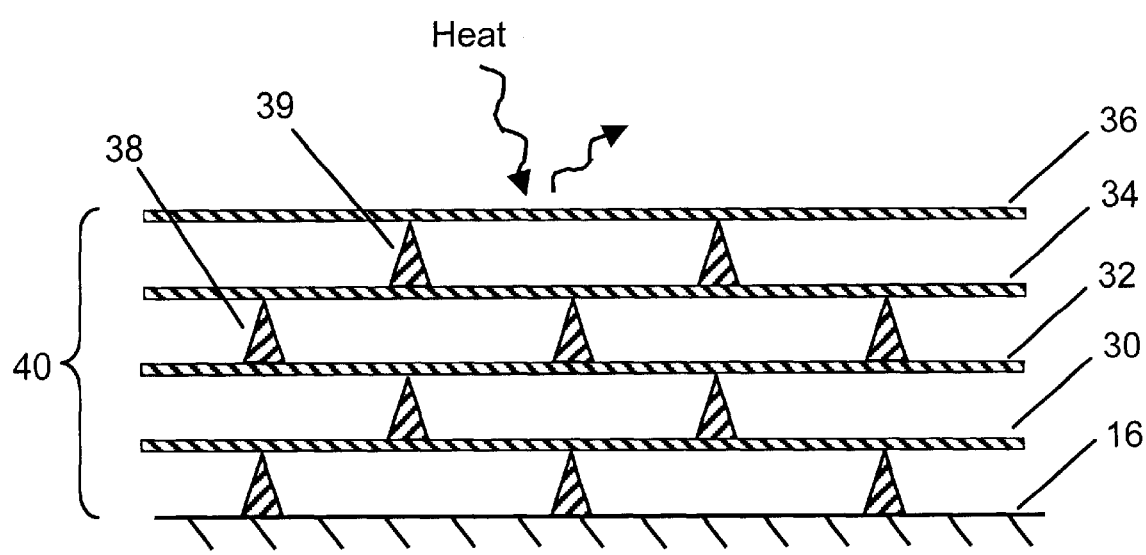
FIG. 4 schematically illustrates a cross-section view of a composite, laminated reflective membrane, according to the present invention.

FIG. 4 schematically illustrates a cross-section view of another example of a micro heat barrier (MHB), according to the present invention. MHB 40 comprises at least two stacked layers of IR reflective membranes supported by a plurality of microsupports 38, 39. In this example, MHB 40 is attached to substrate 16 and has four reflective membranes 30, 32, 34, and 36, that are arranged substantially parallel to each other. Adjacent reflective membranes are spaced apart from each other by a plurality of widely spaced microsupports 38, 39. The distance between adjacent reflective membranes can be 1–100 microns. The gap between reflective membranes can be evacuated to minimize gas phase conduction and convection. The thickness of the gap can vary from level to level, determined by the height of the microsupports 38, 39. The use of multiple reflective layers (e.g., 4) provides multiple boundaries and multiple chances to reflect incident IR radiation away from substrate 16, thereby providing more effective thermal insulation than a single reflective layer.

For a well-evacuated multilayer insulation, it is well-known that heat is transmitted primarily by radiation across the gap, and by conduction through the solid supports (i.e., microsupports 38, 39). The apparent thermal conductivity, $k_{app}$, can be determined by the following equation:

$$k_{app}=(N/\Delta X)^{-1}[h_s+\sigma\epsilon(T_h^2+T_c^2)(T_h+T_c)/(2-\epsilon)] \quad (1)$$

where N is the total number of reflective membranes, $\Delta X$ is the distance (i.e., gap) between two adjacent foils, $h_s$ is the effective solid conductance of the spacer material (i.e., microsupports 38, 39), $\sigma$ is the Stefan-Boltzman constant, $\epsilon$ is the thermal emissivity of the reflective membranes, $T_h$ is the temperature on the hot side, and $T_c$ is the temperature on the cold side (in degrees Kelvin). See *Cyrogenic Process Engineering*, Klaus D. Timmerhaus and Thomas M. Flynn, pp. 387–399.

Inspection of equation (1) shows that the apparent thermal conductivity of a multilayered micro heat barrier (e.g., MHB 40) is inversely proportional to the number of reflective membranes per unit thickness of each layer, and is directly proportional to the reflective membrane's emissivity. The solid conductance, $h_s$, of the spacer is proportional to the spacer's thermal conductivity, and inversely proportional to the spacer's average cross-sectional area. Since oxidized metal foils have relatively high emissivity (i.e., 30–40%), a large number of stacked foils is required (e.g., 60–80) to significantly reduce the effective thermal conductivity of the entire stack. However, if the foil's emissivity is low (5–10%), then only a few layers are required to achieve the same level of thermal insulation (e.g., less than about 10 layers). Likewise, for very low emissivity (e.g. 1–2%), such as for. smooth or polished gold, only a few layers (e.g., 1–3 layers) are needed to provide the same level of thermal insulation.

FIG. 4 illustrates that the location of microsupports 38 supporting one layer can be staggered (i.e., laterally offset) from the location of microsupports 39 supporting an adjacent layer, to minimize solid heat conduction by providing a longer path to conduct heat.

FIGS. 5(a)–5(f) schematically illustrate cross-section views of sequential stages of an example of a process for fabricating a single-layered micro heat barrier (MHB), according to the present invention.

Figure 5A:
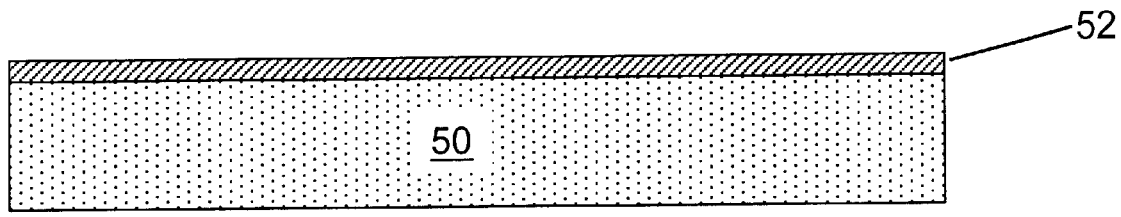
FIGS. 5(a)–5(f) schematically illustrate cross-section views of sequential stages of an example of a process for fabricating a single-layered micro heat barrier (MHB), according to the present invention.
Figure 5B:
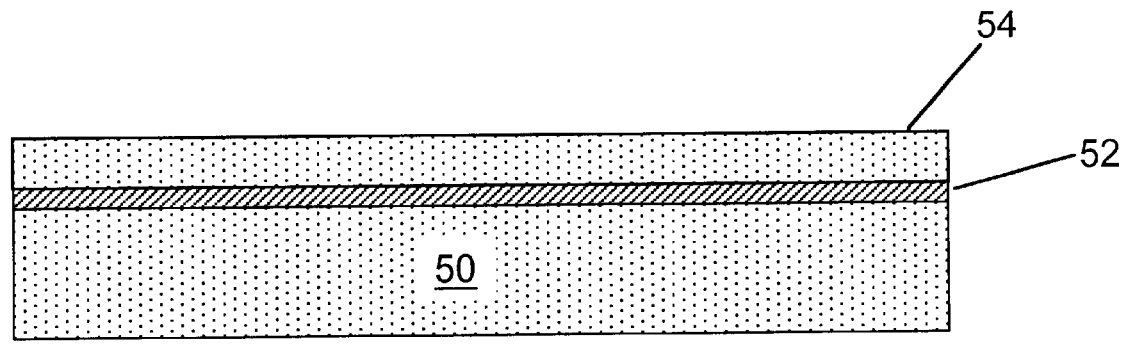

In FIG. 5(a), an etch stop layer 52 has been deposited or grown on top of substrate 50. Substrate 50 is substantially flat, and comprises a dielectric material, such as GaAs, Ge, Indium-phosphate, or Si. Stop layer 52 can be AlGaAs, epitaxial AlGaAs, or SiO$_2$. Next, in FIG. 5(b), a second layer 54 (e.g., epitaxial GaAs) has been deposited on top of stop layer 52.

Figure 5C:
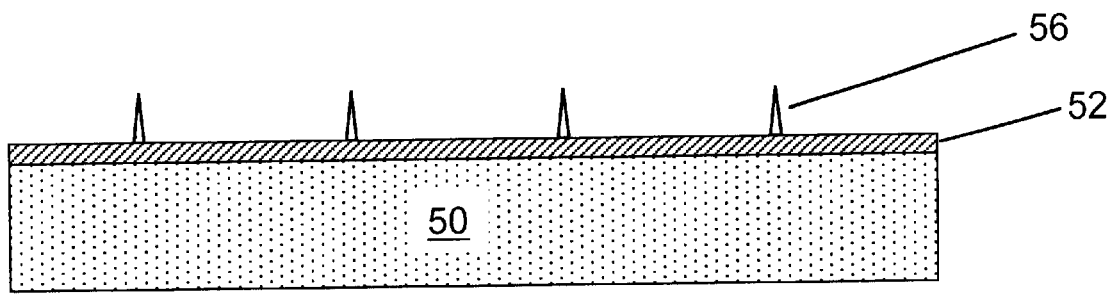

Then, in FIG. 5(c), second layer 54 has been patterned and etched to make a plurality of free-standing microsupports 56. The etching step can be a semi-isotropic dry plasma etch, or a reactive ion etch, using an active chemical, such as chlorine, fluorine, a halogen, or an iodide. Substrate 50 can be heated to enhance etching rates. Unlike physical sputtering, which would produce a flat-topped microsupport 56, semi-isotropic dry etching can produce an undercutting effect, resulting in a sharp-tipped, cusp-like microspike geometry, like that shown previously in FIG. 1(d). Alternatively, material 54 can be selectively removed by sputtering.

Alternatively, microsupports 56 can be fabricated using well known techniques for fabricating MEMS structures, such as the SUMMIT-IV or SUMMIT-V process. In this case, microsupports 56 would comprise polysilicon or silicon nitride, rather than GaAs.

Microsupport 56 can also be fabricated from a silicon wafer using SF$_6$/O$_2$ reactive ion etching coupled with, or without, laser interferometry to make precision-fabricated free-standing posts, walls, trenches, and/or spikes having sub-micron to micron features. This technique is described in more detail in U.S. patent application, Enhanced Light Absorption of Solar Cells and Photodetectors by Diffraction," filed Apr. 11, 2001, Ser. No. 09/834,308 by J. Gee and S. Zaidi, which is hereby incorporated herein by reference.

Figure 5D:
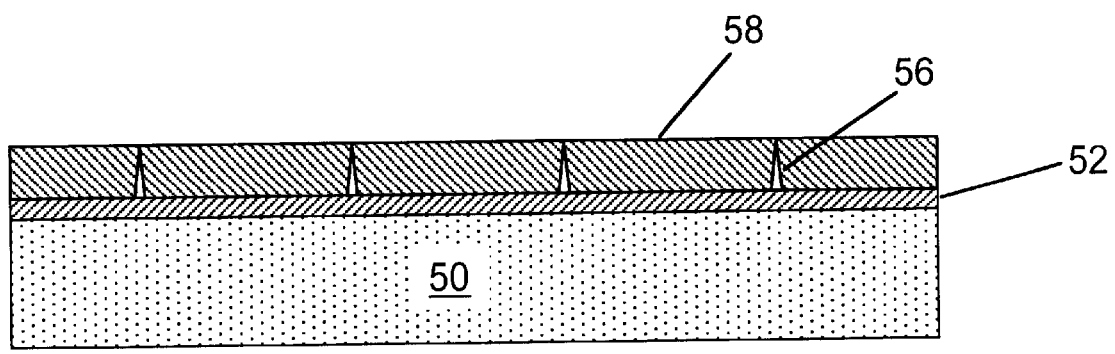

Next, in FIG. 5(d), a temporary protective layer 58 has been applied to the freestanding array of microsupports 56. Temporary protective layer 58 can be a photoresist material, SiO$_2$, a vapor-deposited self-assembling material (SAM coating, parylene), or a water-soluble material, such as starch. Temporary protective layer 58 protects the fragile, free-standing microsupports 56 from damage because it surrounds and encapsulates the microsupports 56. Then, the planarized wafer can be lapped smooth (e.g., to 50 microns) after depositing temporary protective layer 58.

Figure 5E:
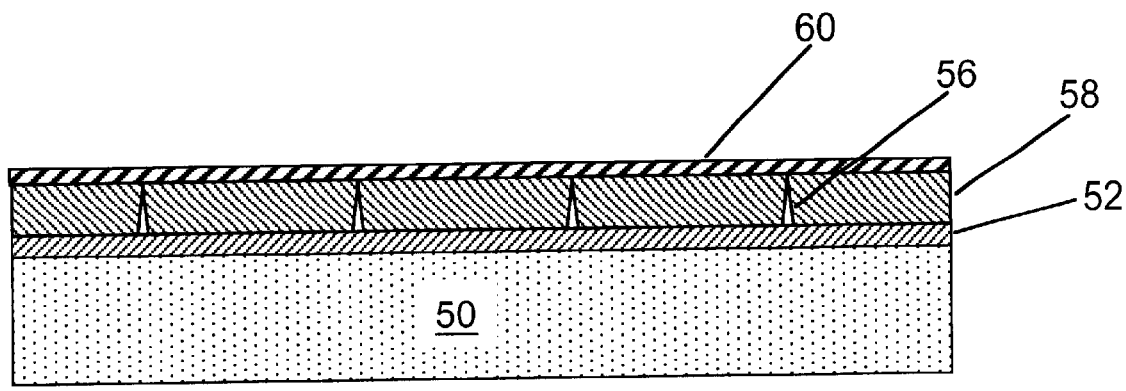

Next, in FIG. 5(e), an IR reflective layer 60 has been deposited on top of temporary layer 58. As discussed earlier, IR reflective layer 60 can comprise gold, or other IR reflective materials. IR layer 60 (e.g., gold) can be physical vapor deposited, chemical vapor deposited, sputter deposited, chemically deposited, or electroplated. Thin film adhesion layers, such as Ti, Cr, and Pd, can be used to improve adhesion of a gold reflective membrane to semi-conductor substrates, such as silicon, polysilicon, Ge, or GaAs.

Figure 5F:
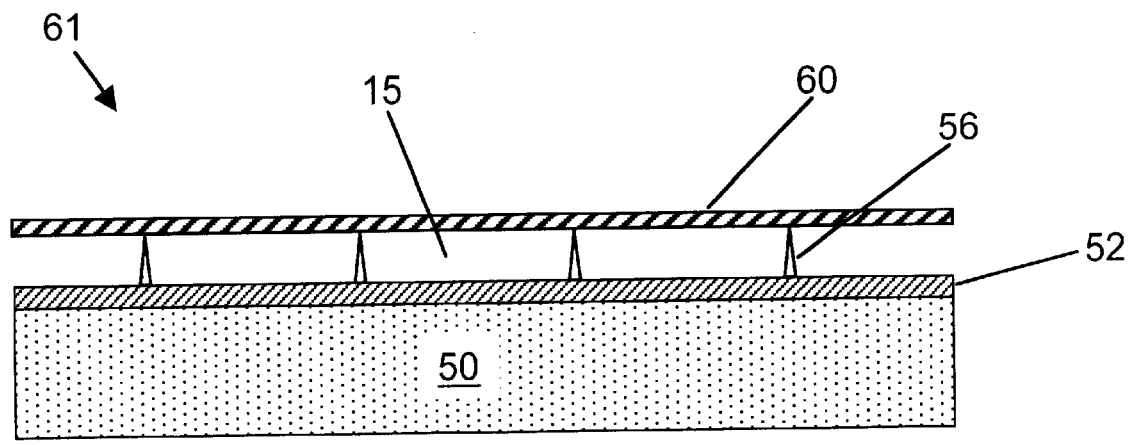

Finally, in FIG. 5(f), temporary protective layer 58 has been removed using a chemical bath or dry plasma etch (e.g., as is used to release MEMS structures by removing the glass sacrificial layer). Removal of temporary protective layer 58 A creates gap 15 between reflective layer 60 and substrate 52, 50. As discussed earlier, gap 15 can be evacuated to eliminate gas phase conduction and convection modes of heat transfer. This completes fabrication of a single-layered micro heat barrier.

FIGS. 6(a)–6(g) schematically illustrate cross-section views of sequential stages of another example of a process for fabricating a multi-layered micro heat barrier (MHB), according to the present invention.

Figure 6A:
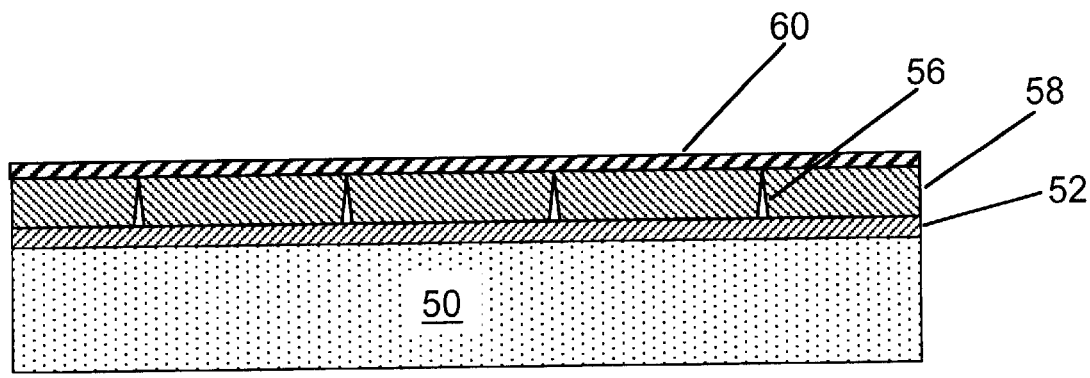
FIGS. 6(a)–6(g) schematically illustrate cross-section views of sequential stages of another example of a process for fabricating a multi-layered micro heat barrier (MHB), according to the present invention.
Figure 6B:
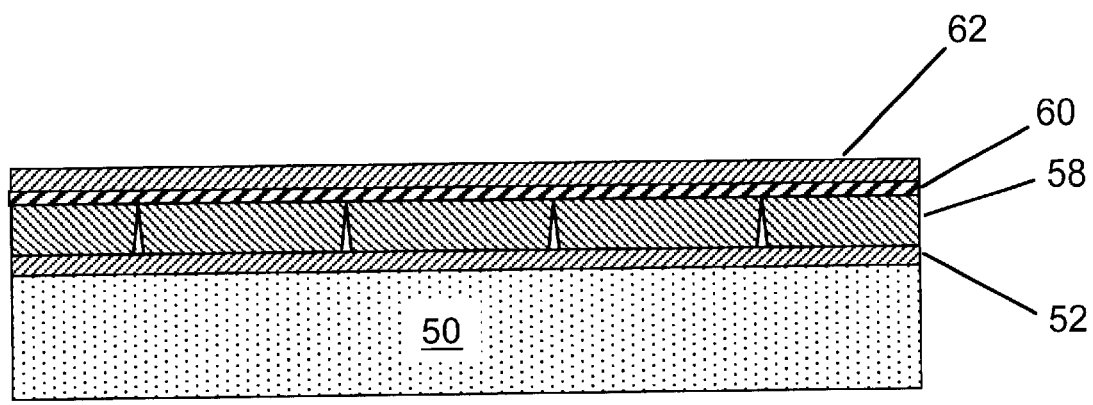

The process begins in FIG. 6(a) where the previous process left off in FIG. 5(e), where a first temporary protective layer 58 surrounds a first layer of microsupports 56. Next, in FIG. 6(b), an etch stop layer 62 has been deposited or grown on top of IR reflective layer 60. Stop layer 62 can be, for example, an epitaxial layer of AlGaAs. Alternatively, etch stop layer 62 is not deposited, if it is not needed.

Figure 6C:
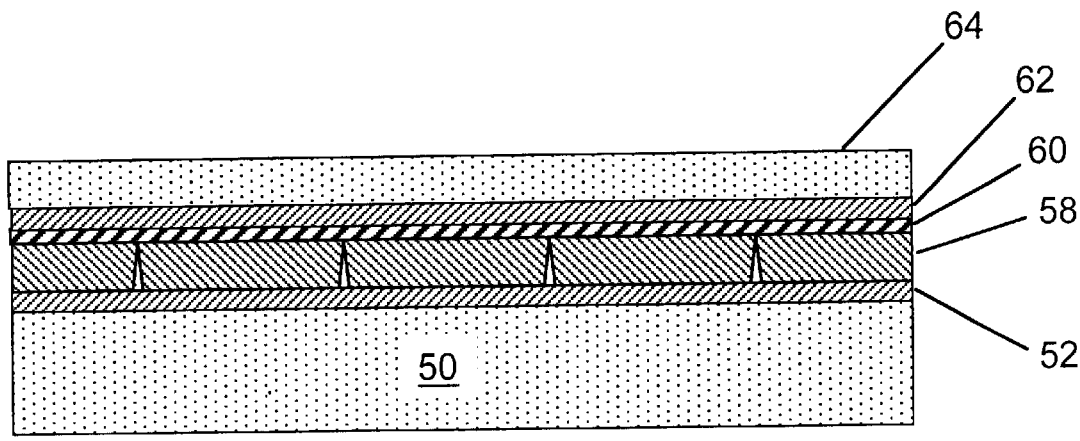

Next, in FIG. 6(c), a second layer 64 (e.g., epitaxial GaAs) has been deposited on top of stop layer 62.

Figure 6D:
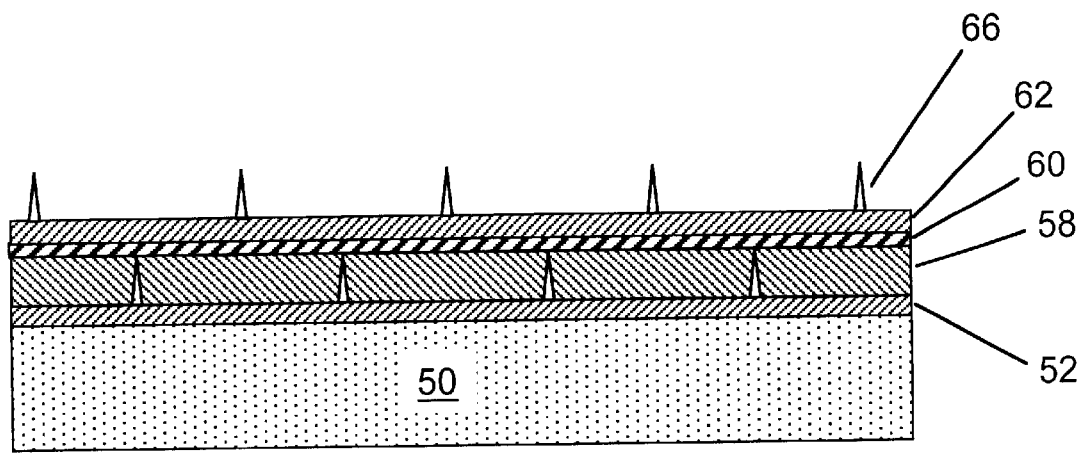

Then, in FIG. 6(d), second layer 64 has been patterned and etched to make a second array of free-standing microsupports 66 (or microcones or microspikes). The etch step can be a semi-isotropic dry plasma etch using an active chemical, such as chlorine, fluorine, a halogen, or an iodide. Substrate 50 can be heated to enhance etching rates. Unlike physical sputtering, which would produce a flat-topped microsupport 66, semi-isotropic dry etching can produce an undercutting effect, resulting in a sharp-tipped, cusp-like microspike geometry, as shown previously in FIG. 1(d). Alternatively (not shown), microsupports 66 can be produced by selectively sputter removing material 64 in-between microsupports 66.

Figure 6E:
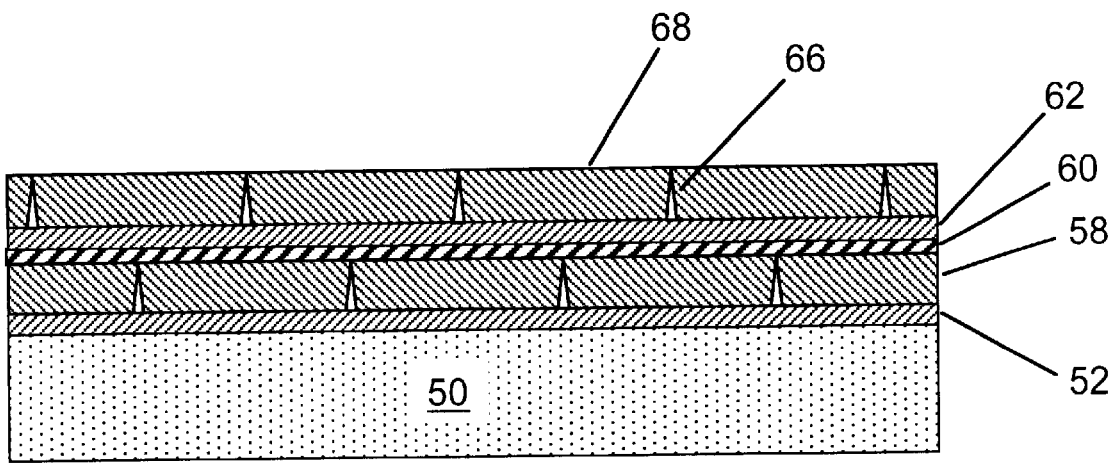

Next, in FIG. 6(e), a second temporary protective layer 68 has been applied to the free-standing array of microsupports 66. Second temporary protective layer 68 can be a photoresist material, a vapor-deposited self-assembling material, such as parylene, or a water-soluble material, such as starch. Second temporary protective layer 68 can comprise the same material as first temporary protective layer 58. Second temporary protective layer 68 protects the second array of free-standing microsupports 66 from damage.

Figure 6F:
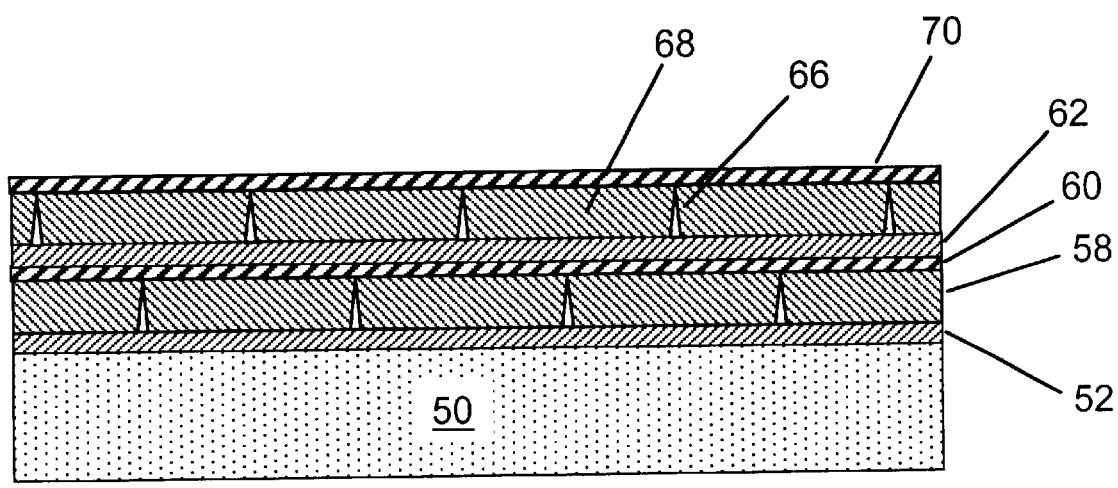

Next, in FIG. 6(f), a second IR reflective layer 70 has been deposited on top of second temporary protective layer 68. As discussed earlier, second IR reflective layer 70 can comprise gold, or other IR reflective materials. Second IR layer 70 (e.g., gold) can be physical vapor deposited, chemical vapor deposited, sputter deposited, or electroplated.

Figure 6G:
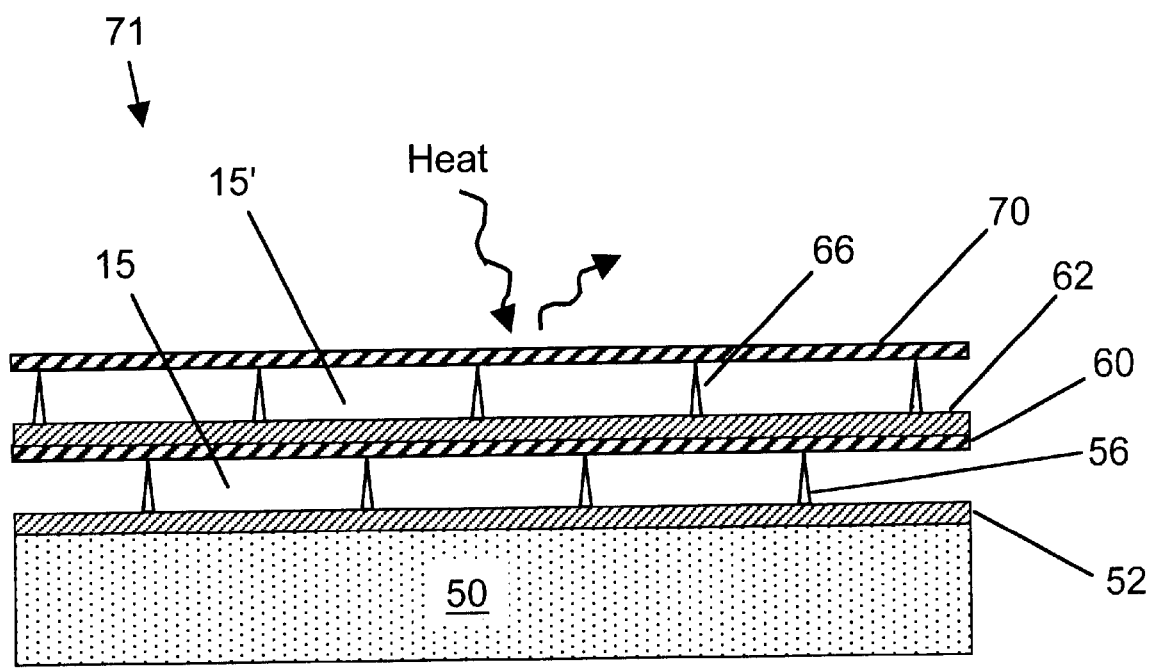

Finally, in FIG. 6(g), both first temporary protective layer 58 and second temporary protective layer 68 have been removed using a chemical bath or dry plasma etching. Removal of both temporary protective layers 58, 68 creates gaps 15, 15' between the reflective layer 60 and 70, and between layer 60 and substrate 52, 50. As discussed earlier, the gaps can be evacuated to eliminate gas phase conduction and convection modes of heat transfer. This completes fabrication of a multilayered micro heat barrier.

Figure 7A:
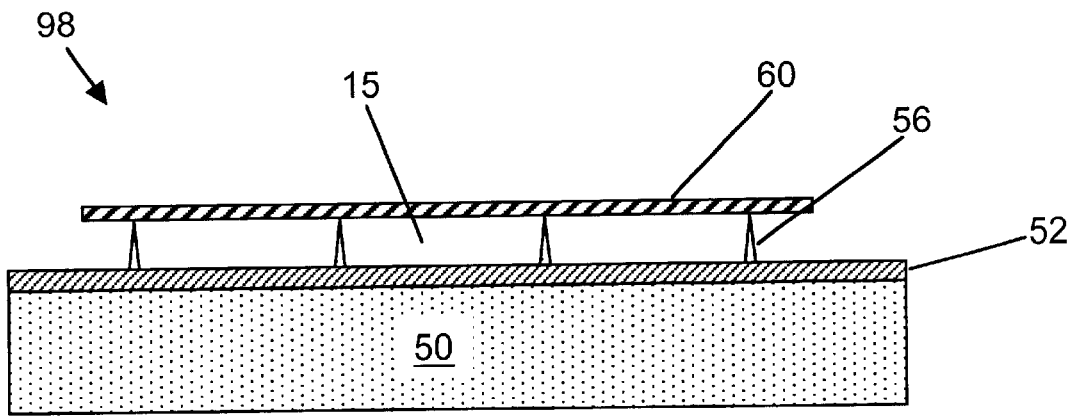
FIGS. 7(a)–7(c) schematically illustrate cross-section views of sequential stages of another example of a process for fabricating a multi-layered micro heat barrier (MHB), according to the present invention.
Figure 7B:
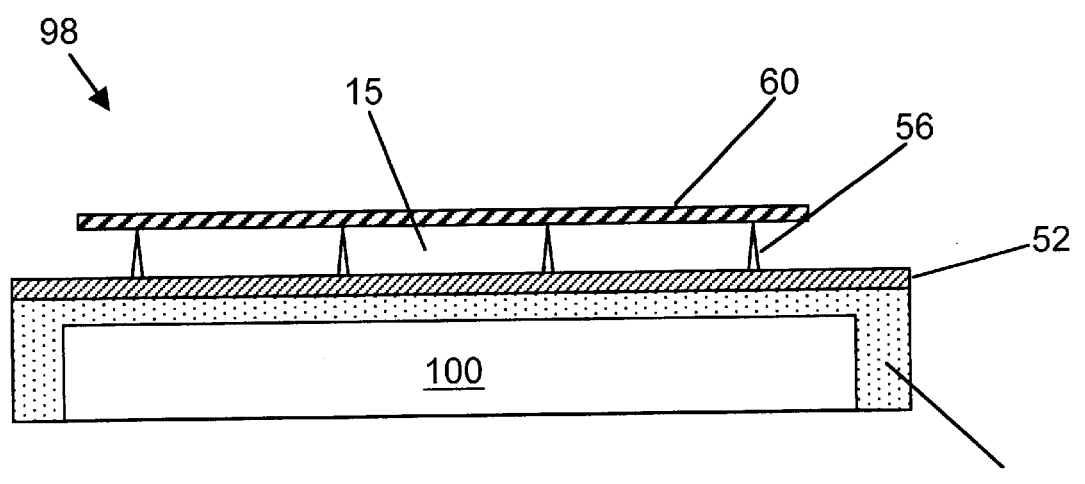
Figure 7C:
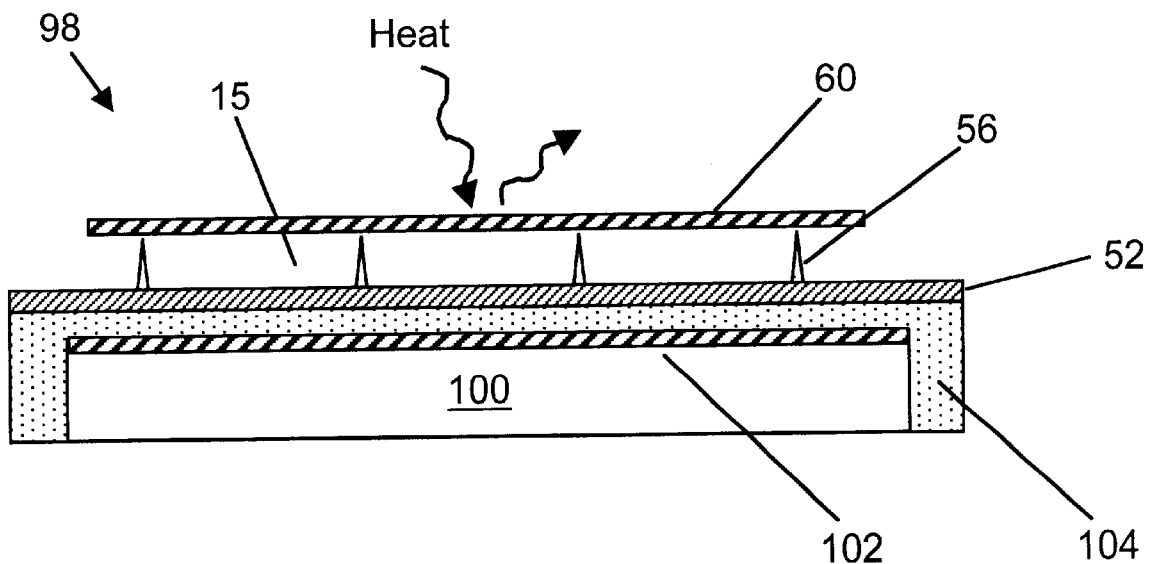

FIGS. 7(a)–7(c) schematically illustrate cross-section views of sequential stages of another example of a process for fabricating a multi-layered micro heat barrier (MHB), according to the present invention. The process begins in FIG. 7(a) where the previous process left off in FIG. 5(f). However, the width of IR reflective layer 60 is slightly less than before.

Next, in FIG. 7(b), a recessed volume 100 has been removed from the backside of substrate 50, leaving a frame-like structure with a pair of legs 104 located on either side of volume 100. Volume 100 can be made by patterning and etching substrate 50. Creating of empty volume 100 increases the thermal resistance to heat flow by increasing the path length and forcing the heat to flow laterally and then down the legs 104, rather than directly through substrate 50.

Next, in FIG. 7(c), an IR reflective material 102 has been deposited on the upper inside surface of recessed volume 100 on substrate 50. This further reduces the apparent thermal conductivity of micro heat barrier 98 by adding another radiation shield layer.

Figure 8:
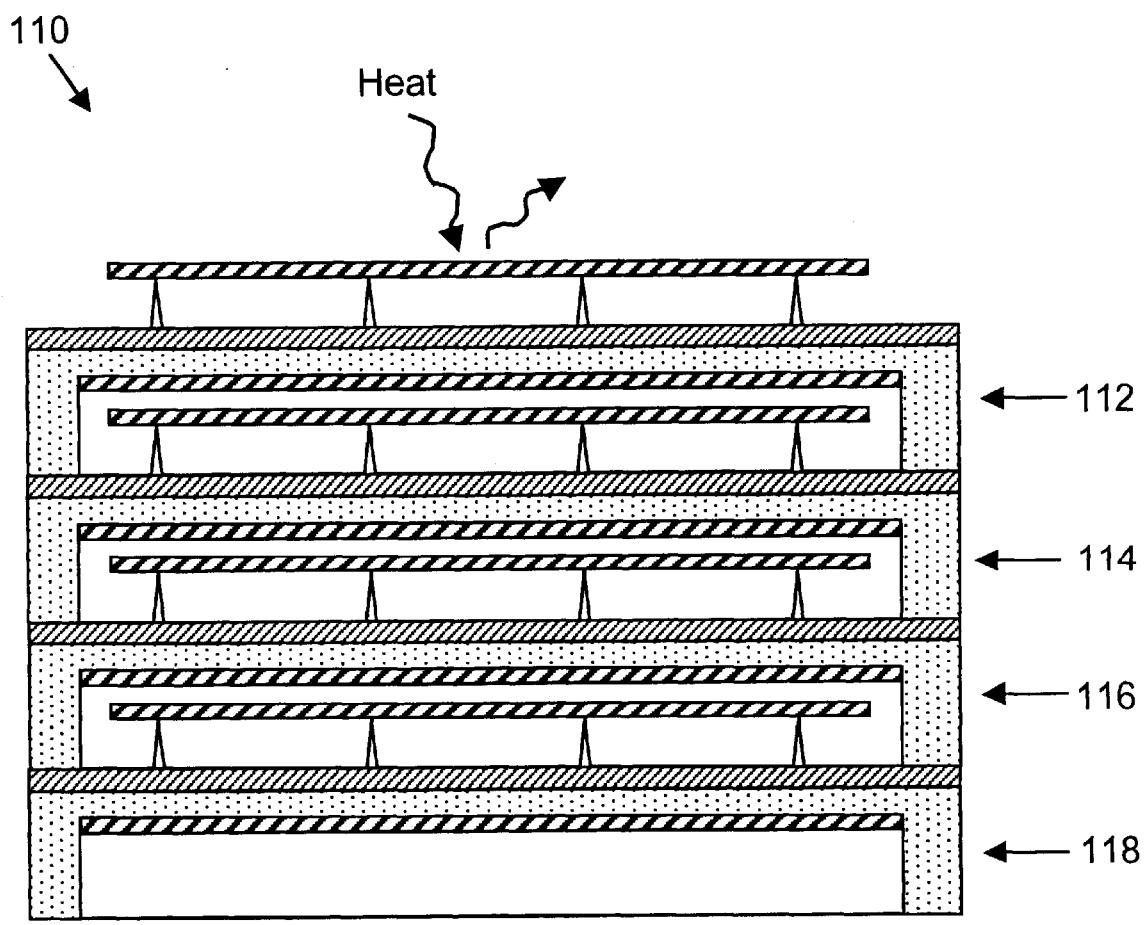
FIG. 8 schematically illustrates a cross-section view of another example of a micro heat barrier (MHB) according to the present invention.

FIG. 8 schematically illustrates a cross-section view of another example of a micro heat barrier (MHB) according to the present invention. This example shows a total of four, individual MHB units 112, 114, 116, 118 stacked one on top of another (of the design shown in FIG. 7(c)), and bonded together to make a laminated, monolithic, multileveled assembly having a total of thirteen highly reflective surfaces to efficiently reflect IR radiation. The gaps in-between surfaces can be evacuated, as before. A variety of well known techniques can be used to bond the multiple MHB units together, including wafer bonding, anodic bonding, and adhesive bonding.

Figure 9:
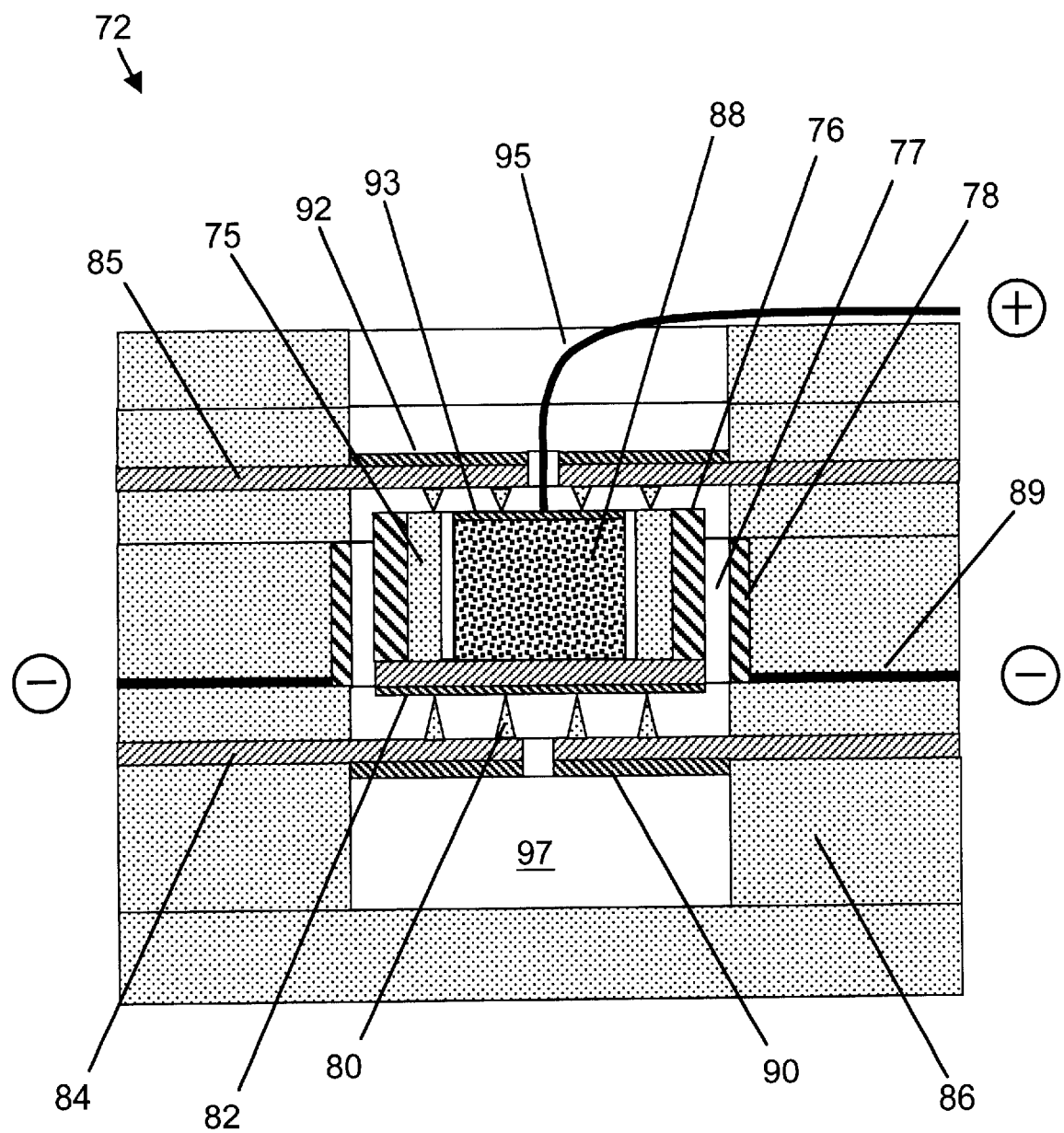
FIG. 9 schematically illustrates a cross-section view of an example of a self-powered microminiature thermionic converter that uses multiple micro heat barriers (MHB) to thermally isolate a radioactive heat source, according to the present invention.

FIG. 9 schematically illustrates a cross-section view of an example of a self-powered microminiature thermionic converter that uses micro heat barriers (MHB's) to thermally isolate a radioactive micro heat source (e.g., 100 microns thick), according to the present invention. The device illustrated in FIG. 7 is a self-powered microminiature thermionic converter. Micro heat barriers are directly integrated into the thermionic converter 72, and all parts of converter 72 are integrally fabricated using IC semiconductor, micromachine, and/or MEMS fabrication techniques. Radioisotope heat source 88 sits inside of cup 75. The outside surface of cup 75 is coated with a thermionic electron emissive material 76. Heat source 88 is thermally isolated from it's colder surroundings by top and bottom micro heat barriers, comprising microcones 80 and multiple gold IR reflective layers 82, 90, 92, 93. Microcones 80 are fabricated on epitaxial GaAs layers 84, 85. Substrate wafer 86 is made of GaAs. The thermionic collector comprises an annular ring of thermionic electron emissive material 78 deposited on substrate 86 inside of an open volume. Interelectrode gap 77 separates the emitter electrode 76 from the collector electrode 78 by about 1 micron. The high temperatures (e.g., 1000 K) reached by the thermally insulated source 88 causes thermal emission of electrons from emitter electrode 76, which stream across gap 77, and are deposited on collector electrode 78, creating a voltage difference across electrical leads 95 and 89. Plenum 97 collects helium gas produced by alpha particle decay of radioactive source 88. Use of micro heat barriers in thermionic convertor 72 provides highly effective thermal insulation that allows the heat source 88 and surrounding electron emissive material 76 to reach sufficiently high temperatures so as to emit sufficient electrons to generate a significant amount of electrical current from such a device.

Figure 10:
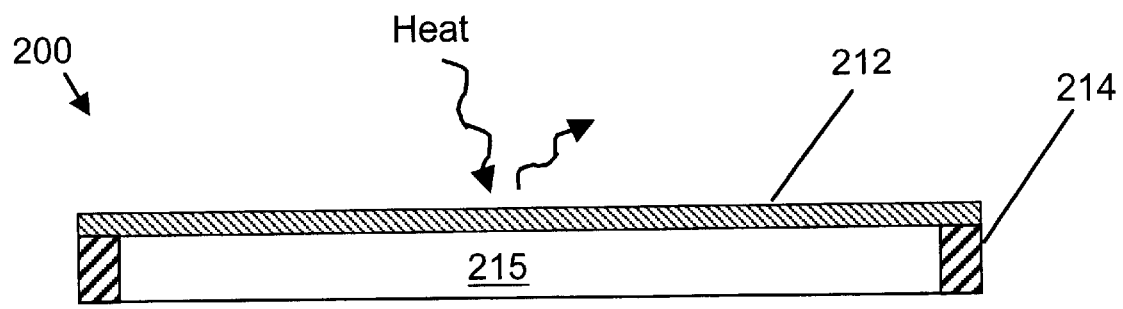
FIG. 10 schematically illustrates a cross-section view of another example of a micro heat barrier (MHB) according to the present invention.

FIG. 10 schematically illustrates a cross-section view of an example of a micro heat barrier (MHB) according to the present invention. MHB 200 comprises an IR reflective membrane 212 attached to and supported by a microframe 214 (i.e., window frame or picture frame) upon which membrane 212 is "stretched", as in a drumhead. The geometry of microframe 214 can be, for example, square, rectangular, or circular. Microframe 214 can be fabricated from a silicon wafer that is patterned and etched on its backside to crease open recess 215 (also referred to as gap 215). Reflective membrane 212 can be a gold microfoil, e.g., 1 micron thick. Gap 215 can be evacuated. Heat loss in MHB 200 is likely dominated by heat conduction through microframe 214 to a cold surface.

Figure 11:
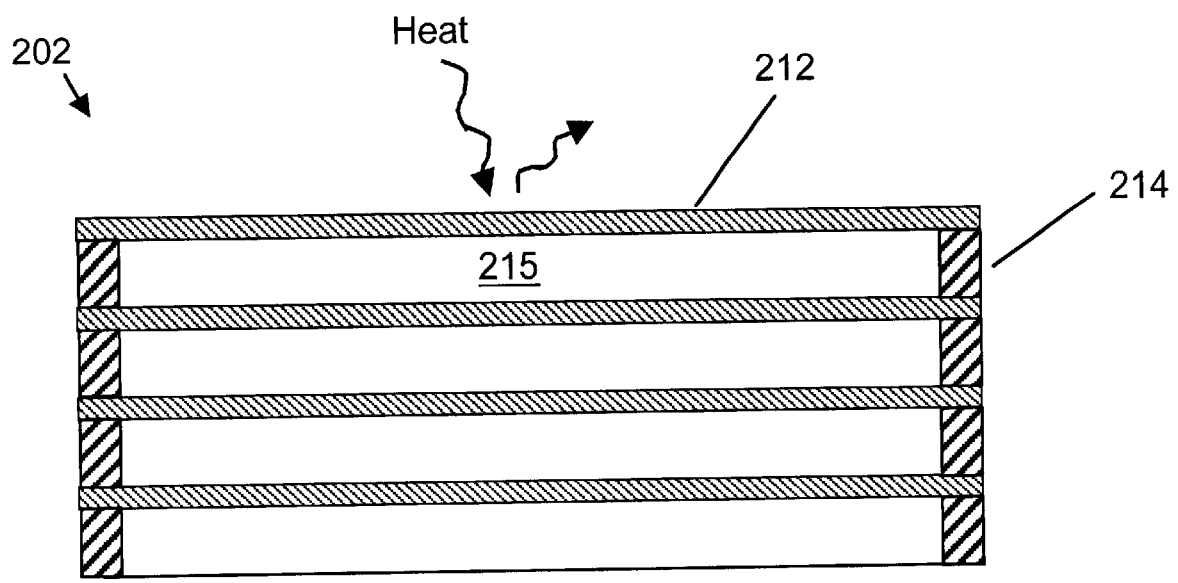
FIG. 11 schematically illustrates a cross-section view of another example of a micro heat barrier (MHB) according to the present invention.

FIG. 11 schematically illustrates a cross-section view of an example of a micro heat barrier (MHB) according to the present invention. Here, MHB 202 comprises a series of MHB's 200 from FIG. 10 (e.g., 4 units) that are stacked on top of each other and bonded together or otherwise held in place by external means to make a laminated, monolithic, multileveled assembly. Use of multiple layers of reflective membrane 212 decreases the apparent thermal conductivity by providing multiple layers to reflect IR radiation. Methods for bonding the individual microframes 214 of MHB's 200 include wafer bonding, anodic bonding, and adhesive bonding.

Figure 12:
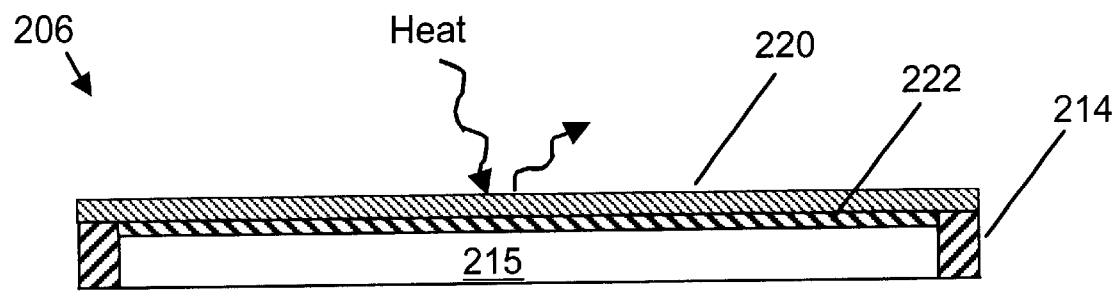
FIG. 12 schematically illustrates a cross-section view of another example of a micro heat barrier (MHB) according to the present invention.

FIG. 12 schematically illustrates a cross-section view of an example of a micro heat barrier (MHB) according to the present invention. MHB 206 comprises an IR reflective material 222 deposited on a structural membrane 220, where structural membrane 220 is attached to and supported by microframe 214 (i.e., window frame or picture frame) upon which structural membrane 220 is "stretched", as in a drumhead. The geometry of microframe 214 can be, for example, square, rectangular, or circular. Microframe 214 can be fabricated from a silicon wafer that is patterned and etched on its backside to crease open recess 215 (also referred to as gap 215). Reflective material 222 can be a thin gold coating (e.g., 1000 Angstroms), or it can be a HR stack (see FIG. 2(b) and Table 1). Gap 215 can be evacuated. Structural membrane 220 can be a low-stress or stress-less silicon nitride or silicon oxynitride film (e.g., 1 micron thick). Reflective material 222 is illustrated in this example as being deposited on the backside of structural membrane 220, however, the reflective material 222 can also be deposited on the front (i.e., top) side of structural membrane 220, or on both sides, as needed.

An example of a process for manufacturing the MHB 206 shown in FIG. 12, according to the present invention, is as follows. A silicon wafer is provided and then oxidized to a depth of 1 micron (i.e., to form a silicon dioxide etch stop layer). Next, a 1 micron thick layer of a low-stress or stress-less silicon nitride or silicon oxynitride film is deposited on the oxidized silicon wafer to form structural membrane 220. Then, the back of the wafer is patterned and etched down to the silicon dioxide stop layer, creating gap 215 and microframe 214. Then, the silicon dioxide stop layer is removed. Next, a high reflection (HR) coating (e.g., alternating layers of $SiO_2$ and $TiO_2$) or metallic IR reflective material (e.g. gold), is deposited on the backside (or frontside, or both) of the silicon nitride layer 220 to form reflective material 222. Finally, the wafer is lapped to 50 microns.

Figure 13:
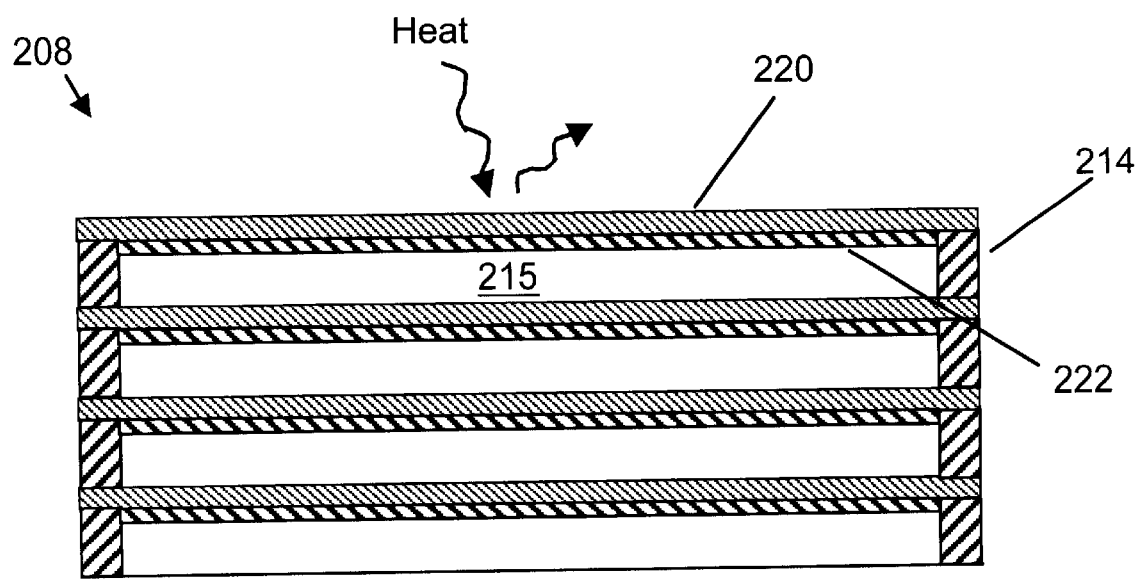
FIG. 13 schematically illustrates a cross-section view of another example of a micro heat barrier (MHB) according to the present invention.

FIG. 13 schematically illustrates a cross-section view of an example of a micro heat barrier (MHB) according to the present invention. Here, MHB 208 comprises a series of MHB's 206 from FIG. 12 (e.g., 4 units) that are stacked on top of each other and bonded together or otherwise held in place by external means to make a laminated, monolithic, multileveled assembly.

Figure 14:
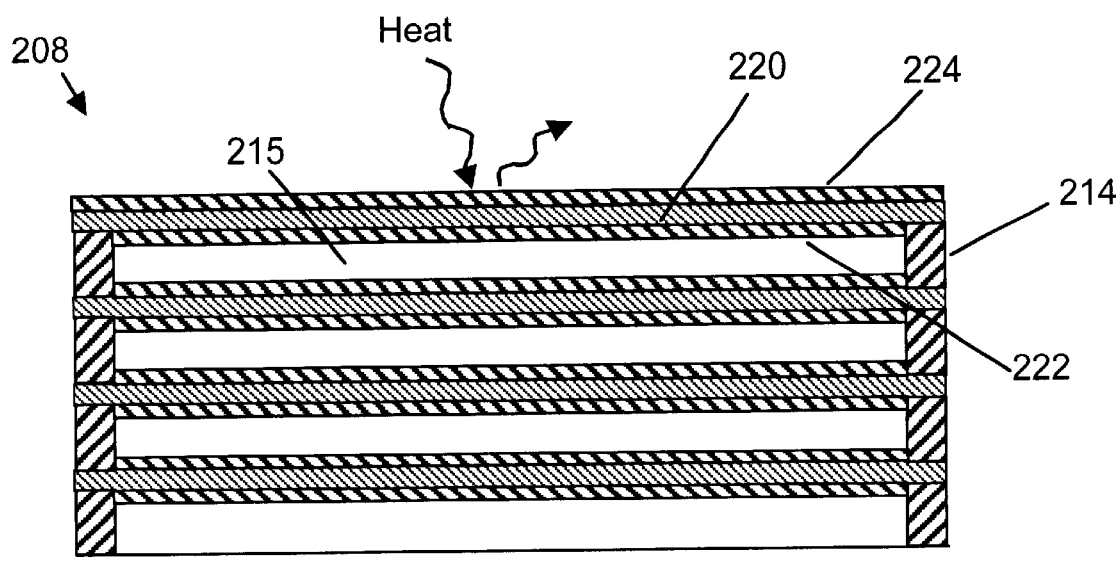
FIG. 14 schematically illustrates a cross-section view of another example of a micro heat barrier (MHB) according to the present invention.

FIG. 14 schematically illustrates a cross-section view of an example of a micro heat barrier (MHB) according to the present invention. Here, MHB 208 comprises a series of MHB's 206 from FIG. 12 (e.g., 4 units) that have been stacked on top of each other, with the microframes 214 bonded together or otherwise held in place by external means to make a laminated, monolithic, multileveled assembly. However, in this example additional layers of reflective material 224 have been deposited on both sides of structural membrane 220.

Figure 15:
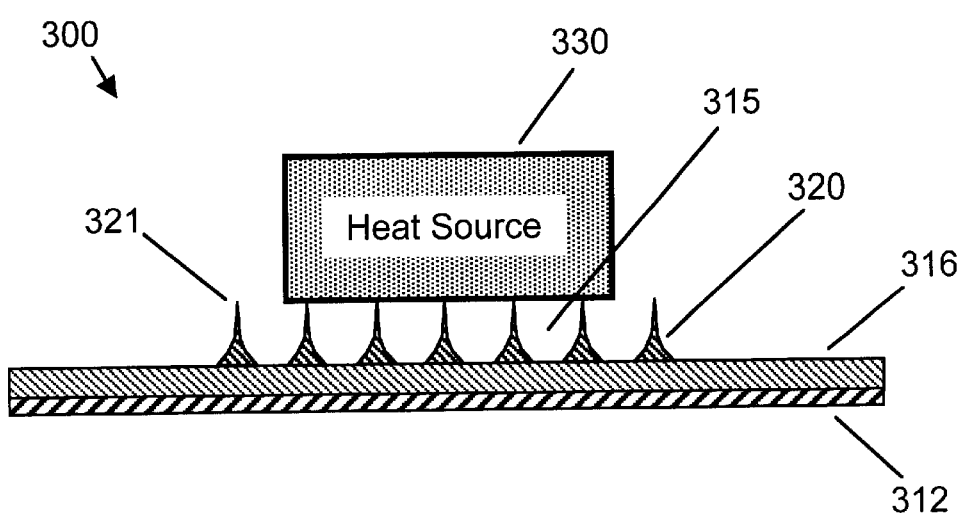
FIG. 15 schematically illustrates a cross-section view of another example of a micro heat barrier (MHB) according to the present invention.

FIG. 15 schematically illustrates a cross-section view of an example of a micro heat barrier (MHB) according to the present invention. MHB 300 comprises a plurality of microspikes 320 disposed on a substrate 316. Heat source 330 has been placed in direct contact with the tips 321 of microspikes 320. In this example, no reflective membrane is used in-between heat source 330 and microspikes 320. Microspikes 320 can be made of epitaxial GaAs, silicon, germanium, or GaAs. Substrate 316 can be made of epitaxial AlGaAs, epitaxial GaAs, silicon, germanium, or GaAs. The diameter of tips 321 can be very small (e.g., 0.1 micron), which provides very little contact area to conduct heat from source 330 to substrate 316. Source 330 can be held in contact with tips 321 by external means (not shown). Optionally, IR reflective layer 312 can be deposited on the backside of substrate 316, if needed. Gap 315 in-between adjacent microspikes 320 can be evacuated to enhance thermal resistance. Alternatively, an IR reflective coating (e.g., gold) can be applied to the bottom surface (or all sides) of heat source 330 to further reduce IR radiative emissions from the source. Alternatively, heat source 330 can be sandwiched in-between (not shown) a duplicate set of MHB's 300 on the top and bottom of source 330 (similar to FIG. 9). Alternatively, MHB 300 can further comprise a plurality of non-metallic, microsupports disposed on the other side of substrate 316 (not shown), wherein each microsupport comprises a sharp, pointed tip.

The particular examples discussed above are cited to illustrate particular embodiments of the invention.

The actual scope of the invention is defined by the claims appended hereto.

What is claimed is:

1. A micro heat barrier, comprising:
    a substrate;
    a plurality of non-metallic freestanding microsupports attached to the substrate; and
    an IR reflective membrane supported by the plurality of microsupports, wherein the reflective membrane is oriented substantially parallel to the substrate.

2. The barrier of claim 1, wherein the microsupports comprise a material selected from the group consisting of silicon, germanium, and gallium arsenide.

3. The barrier of claim 1, wherein the height of the microsupports is less than 100 microns.

4. The barrier of claim 1, wherein the height of the microsupports is 1–10 microns.

5. The barrier of claim 4, wherein the height of the microsupports is 1–3 microns.

6. The barrier of claim 1, wherein the microsupports have a cylindrical shape.

7. The barrier of claim 1, wherein the microsupports have a conical shape.

8. The barrier of claim 1, wherein the microsupports have a cusp-like shape with a pointed tip.

9. The barrier of claim 8, wherein the pointed tip of a microsupport has a diameter less than approximately 0.1 microns.

10. The barrier of claim 1, wherein the plurality of microsupports is arranged in a repeating pattern selected from the group consisting of a square pattern and a hexagonal pattern.

11. The barrier of claim 1, wherein the distance between neighboring microsupports is more than ten times the height of the microsupports.

12. The barrier of claim 6, wherein the diameter of a cylindrically-shaped microsupport is approximately 1 micron.

13. The barrier of claim 1, wherein the substrate comprises GaAs.

14. The barrier of claim 1, wherein the space in-between the reflective membrane and the substrate is filled with a low conductivity gas selected from the group consisting of argon and krypton.

15. The barrier of claim 1, wherein the space in-between the reflective membrane and the substrate is evacuated.

16. The barrier of claim 1, wherein the reflective membrane comprises a material selected from the group consisting of gold, copper, platinum, silver, aluminum, rhodium, titanium, and silicon.

17. The barrier of claim 1, wherein the reflective membrane comprises a laminated composite structure.

18. The barrier of claim 17, wherein the laminated composite structure comprises a structural layer with an attached IR reflective layer.

19. The barrier of claim 18, wherein the structural layer comprises a material selected from the group consisting of silicon nitride, silicon oxynitride, and polysilicon.

20. The barrier of claim 17, wherein the laminated composite structure comprises at least two IR transparent layers laminated together; wherein the first layer comprises a material having a high index of refraction; and wherein the second layer comprises a material having a low index of refraction.

21. The barrier of claim 20, wherein the material having a high index of refraction comprises $TiO_2$; and wherein the material having a low index of refraction comprises $SiO_2$.

22. The barrier of claim 21, wherein the laminated composite structure comprises at least seventeen layers of alternating IR transparent materials laminated together; wherein the first alternating layer comprises $SiO_2$ and the second alternating layer comprises $TiO_2$.

23. The barrier of claim 22, wherein the IR reflectivity of the laminated composite structure is approximately 90% in the wavelength range 1600–2400 nm.

24. The barrier of claim 20, wherein at least one IR transparent material comprises a material selected from the group consisting of silicon, magnesium oxide, silicon nitride, and fluoride.

25. The barrier of claim 1, wherein semiconductor manufacturing techniques are used to fabricate the microsupports and reflective membrane.

26. The barrier of claim 1, wherein MEMS manufacturing techniques are used to fabricate the microsupports and reflective membrane.

27. The barrier of claim 1, wherein the apparent thermal conductivity of the micro heat barrier is less than $10^{-6}$ W/m-K.

28. The barrier of claim 1, wherein the apparent thermal conductivity of the micro heat barrier is less than $10^{-7}$ W/m-K.

29. The barrier of claim 1, further comprising a structural membrane disposed in-between the microsupports and the IR reflective membrane.

30. The barrier of claim 29, wherein the structural membrane comprises a material selected from the group consisting of silicon, polysilicon, silicon nitride, and silicon oxynitride.

31. The barrier of claim 29, wherein the IR reflective membrane comprises a thin gold film having a thickness of 0.1–1 microns.

32. A micro heat barrier, comprising at least two substantially parallel IR reflective membranes supported by a plurality of microsupports, wherein the largest distance between any two neighboring reflective membranes is less than 100 microns.

33. The barrier of claim 32, wherein the reflective membranes comprise gold.

34. The barrier of claim 33, wherein the gold reflective membranes have a thickness approximately equal to 1 micron.

35. The barrier of claim 33, wherein the space in-between adjacent reflective membranes is evacuated.

36. The barrier of claim 33, wherein the microsupports in one layer are laterally offset from microsupports in an adjacent layer.

37. The barrier of claim 33, comprising at least four substantially parallel IR reflective membranes.

38. A micro heat barrier, comprising at least two substantially parallel IR reflective membranes supported by a plurality of non-metallic freestanding microsupports.

39. A micro heat barrier, comprising a gold reflective membrane supported by a plurality of non-metallic microsupports.

40. The barrier of claim 39, wherein the microsupports are widely-spaced apart.

41. The barrier of claim 39, wherein the height of the microsupports is less than ten microns.

42. The barrier of claim 39, wherein the microsupports are fabricated using a reactive ion beam etching process.

43. The barrier of claim 39, wherein the non-metallic microsupports comprise a material selected from the group consisting of gallium arsenide, germanium, and silicon.

44. The barrier of claim 39, wherein the non-metallic microsupports have a cusp-like shape with a pointed tip.

45. A micro heat barrier assembly, comprising at least two micro heat barriers according to claim 1, which are stacked and bonded together to make a which are stacked and bonded together to make a laminated, monolithic, multileveled assembly.

46. The assembly of claim 45, wherein the bond between adjoining micro heat barriers comprises a bond selected from the group consisting of a wafer bond, an anodic bond, and an adhesive bond.

47. A micro heat barrier, comprising a non-metallic frame, having a height less than 100 microns; and an IR reflective membrane attached to the frame.

48. The barrier of claim 47, wherein the IR reflective membrane comprises gold.

49. The barrier of claim 47, wherein the IR reflective membrane comprises a structural layer with an IR reflective material deposited on at least one side of the structural layer.

50. The barrier of claim 49, wherein the structural layer comprises silicon nitride.

51. The barrier of claim 49, wherein the IR reflective material comprises gold.

52. The barrier of claim 49, wherein the IR reflective material comprises an high reflectivity stack comprising a plurality of alternating high and low index of refraction materials.

53. The barrier of claim 49, wherein the thickness of the structural layer is approximately 1 micron.

54. A micro heat barrier assembly, comprising at least two micro heat barriers according to claim 47, which are stacked and bonded together to make a laminated, monolithic, multileveled assembly.

55. The assembly of claim 54, wherein the bond between adjoining micro heat barriers comprises a bond selected from the group consist of a wafer bond, an anodic bond, and an adhesive bond.

56. A micro heat barrier, comprising a plurality of non-metallic, microsupports disposed on at least one side of a substrate, wherein each microsupport comprises a sharp, pointed tip, and wherein a heat source resides in direct contact with the tips of the microsupports.

57. The micro heat barrier of claim 56, wherein the microsupports have a height less than 100 microns.

58. The barrier of claim 56, wherein the microsupports comprise a material selected from the group consisting of silicon, germanium, and gallium arsenide.

59. The barrier of claim 57, wherein the height of the microsupports is 1–10 microns.

60. The barrier of claim 59, wherein the height of the microsupports is 1–3 microns.

61. The barrier of claim 56, wherein the microsupports have a cusp-like shape.

62. The barrier of claim 56, wherein the pointed tip of a microsupport has a diameter less than approximate 0.1 microns.

63. The barrier of claim 58, wherein the substrate comprises a material selected from the group consisting of silicon, germanium, gallium arsenide, and aluminum gallium arsenide.

64. The barrier of claim 58, further comprising an IR reflective material disposed on the other side of the substrate.

65. The barrier of claim 58, further comprising a plurality of non-metallic, microsupports disposed on the other side of the substrate, wherein each microsupport comprises a sharp, pointed tip.

* * * * *